(12) United States Patent
Zhang et al.

(10) Patent No.: US 9,183,334 B1
(45) Date of Patent: Nov. 10, 2015

(54) VERIFICATION OF CONNECTIVITY OF SIGNALS IN A CIRCUIT DESIGN

(71) Applicant: Xilinx, Inc., San Jose, CA (US)

(72) Inventors: Xiaoyang Zhang, San Jose, CA (US); Adam P. Donlin, San Jose, CA (US); Kyle Corbett, Campbell, CA (US); Khang K. Dao, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/323,829

(22) Filed: Jul. 3, 2014

(51) Int. Cl.
*G06F 17/50* (2006.01)

(52) U.S. Cl.
CPC .................. *G06F 17/5045* (2013.01)

(58) Field of Classification Search
CPC ............ G06F 17/5045; G06F 17/5081; G06F 17/5022; G06F 17/8765
USPC .................................................. 716/106, 111
See application file for complete search history.

(56) References Cited

U.S. PATENT DOCUMENTS

| | | | |
|---|---|---|---|
| 6,591,402 B1 * | 7/2003 | Chandra et al. | 716/106 |
| 7,047,173 B1 * | 5/2006 | Larky et al. | 703/14 |
| 7,281,232 B1 * | 10/2007 | Nicolino et al. | 716/112 |
| 8,434,037 B2 * | 4/2013 | Krishnan | 716/107 |
| 8,859,162 B2 * | 10/2014 | Gil et al. | 429/508 |

\* cited by examiner

*Primary Examiner* — Sun Lin
(74) *Attorney, Agent, or Firm* — LeRoy D. Maunu

(57) ABSTRACT

Approaches for verifying connectivity of signals in a circuit design include generating a configured version of the circuit design based on input parameter values. The configured version specifies connections from source pins of ports of circuit blocks of the configured version to destination pins of ports of circuit blocks. Expected source-destination connections between source pins and destination pins of the ports of the circuit blocks of the configured version are determined from the input parameter values. A connectivity checker that includes HDL code is generated based on the expected source-destination connections. For each of the expected source-destination connections, the HDL code forces a first signal value on a source pin of the expected source-destination connection in the configured version of the circuit design and determines whether or not a second signal value at a destination pin of the expected source-destination connection matches the first signal value.

20 Claims, 6 Drawing Sheets

US 9,183,334 B1

VERIFICATION OF CONNECTIVITY OF SIGNALS IN A CIRCUIT DESIGN

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

The disclosure generally relates to verifying the connectivity of signals between circuit blocks, or signals remaining at constant values, or unconnected pins in a circuit design.

BACKGROUND

Some circuit design tools provide developers with the capability to customize generic forms of circuit designs in order to implement circuits that are suitable for each developer's particular application. The generic forms of the circuit designs are sometimes referred to as logic cores or intellectual property (IP) cores. Developers rely on logic cores to reduce development time and costs.

The parameterization available for some logic cores may result in a very large number of possible combinations of signal connections between circuit blocks of the logic core. Verifying that the signal connections are correct is imperative. However, using a functional verification approach to verify correct signal connectivity would consume a large number of simulation resources and involve significant efforts to develop suitable test benches. The number of simulation runs required to check the correct signal connections may be very large in logic cores having a large number of connections to check. For example, in gigabit transceivers that are available in devices from XILINX®, Inc., the transceiver has 52 channels, and each channel has 335 signal pins, 66 quad pins, and 30 pins for helper logic blocks. This results in 22,412 (52*(335+66+30)) pins with a large number of signal connections between those pins to check.

SUMMARY

A method of verifying connectivity of signals in a circuit design is performed on a programmed processor and includes inputting parameter values that customize a parameterizable version of the circuit design. The method generates a configured version of the circuit design based on the input parameter values. The configured version of the circuit design specifies connections from a plurality of source pins of ports of circuit blocks of the configured version to a plurality of destination pins of ports of circuit blocks of the configured version. Expected source-destination connections between source pins and destination pins of the ports of the circuit blocks of the configured version are determined from the input parameter values. A connectivity checker that includes HDL code is generated based on the expected source-destination connections. For each of the expected source-destination connections, the HDL code forces a first signal value on a source pin of the expected source-destination connection in the configured version of the circuit design and determines whether or not a second signal value at a destination pin of the expected source-destination connection matches the first signal value.

A system of verifying connectivity of signals in a circuit design includes one or more processors coupled to a memory. The memory is configured with instructions that when executed by the one or more processors cause the one or more processors to input parameter values that customize a parameterizable version of the circuit design. A configured version of the circuit design is generated based on the input parameter values. The configured version specifies connections from a plurality of source pins of ports of circuit blocks of the configured version to a plurality of destination pins of ports of circuit blocks of the configured version. Expected source-destination connections between source pins and destination pins of the ports of the circuit blocks of the configured version are determined from the input parameter values. A connectivity checker that includes HDL code is generated based on the expected source-destination. For each of the expected source-destination connections, the HDL code forces a first signal value on a source pin of the expected source-destination connection in the configured version of the circuit design and determines whether or not a second signal value at a destination pin of the expected source-destination connection matches the first signal value.

Other features will be recognized from consideration of the Detailed Description and Claims, which follow.

BRIEF DESCRIPTION OF THE DRAWINGS

Various aspects and features of the method and system will become apparent upon review of the following detailed description and upon reference to the drawings in which.

DETAILED DESCRIPTION OF THE DRAWINGS

In the following description, numerous specific details are set forth to describe the specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

The disclosed approaches of verifying connectivity of signals in a circuit design automatically generate a connectivity checker based on the parameter values chosen for the circuit design. The term circuit design may be used interchangeably with logic core in this description. The generated connectivity checker is specified in a hardware description language (HDL), which permits it to be complied and simulated with the circuit design or with dummy circuit blocks substituted for circuit blocks of the circuit design.

Based on input parameter values that customize a parameterizable circuit design, a configured version of the circuit design is generated. The configured version specifies connections from source pins of ports of circuit blocks of the circuit design to destination pins of ports of circuit blocks of the circuit design. Based on the parameter values which were specified for the configured circuit design, expected source-destination connections between source pins and destination pins of the ports of the circuit blocks of the circuit design are determined. Using the expected source-destination connections, an HDL connectivity checker is generated. For each of the expected source-destination connections, the HDL code in the connectivity checker forces a signal value on the source pin of the expected source-destination connection and determines whether or not the signal value at the destination pin of the expected source-destination connection matches the signal value at the source.

Figure 1:
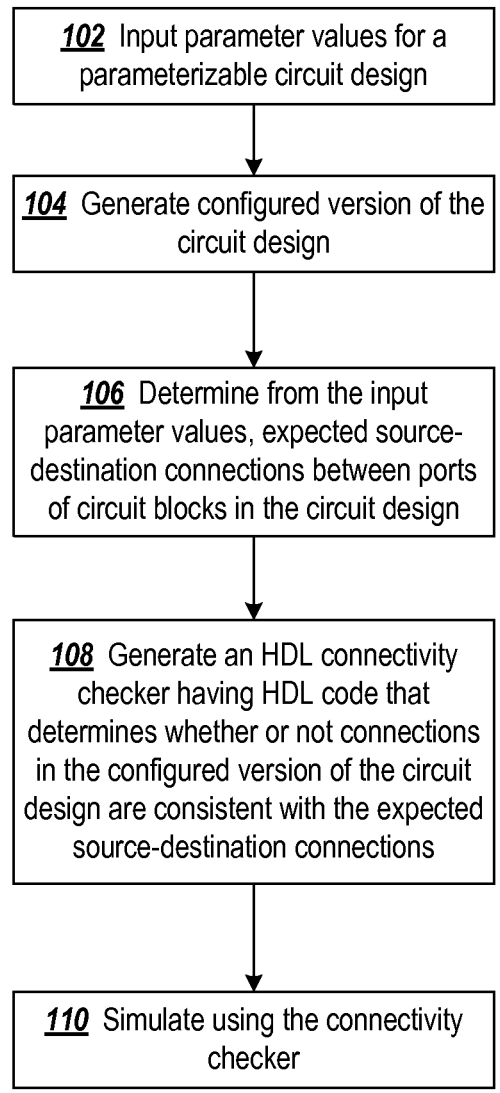
FIG. 1 is a flowchart of an example process of verifying the connectivity between ports of circuit blocks in a circuit design.

FIG. 1 is a flowchart of an example process of verifying the connectivity between ports of circuit blocks in a circuit design. The process may be executed on a computer system programmed to perform the operations described below. At block 102, the parameter values are input in order to customize a parameterizable version of the circuit design. The parameter values may be specified through user interaction with a graphical user interface (GUI), user specification on command lines, or with a script-based interface, for example. The specified parameter values are input by a process of the computer system, and at block 104, a configured version of the circuit design is generated based on the input parameter values. The generating of the configured version of the circuit design may be performed by a design automation tool. The configured version of the circuit design specifies connections from source pins of ports of circuit blocks of the configured version to the destination pins of ports of circuit blocks of the configured version. The specified connections, which were generated by the design tool, are verified against expected connections by generating an HDL connectivity checker and simulating using the connectivity checker.

At block 106, the process determines expected source-destination connections between source pins and destination pins of the ports of the circuit blocks of the circuit design as configured with the input parameter values. The expected source-destination connections are determined from the input parameter values. It will be appreciated that the expected source-destination connections will be dependent on the circuit design under test. At block 106, the process also determines pins at which the signal values are expected to remain at constant values. These pins may be referred to as constant value pins.

At block 108, a connectivity checker is generated. The connectivity checker is specified with HDL code. Generally, for each of the expected source-destination connections, the HDL code of the connectivity checker forces a first signal value on a source pin of the expected source-destination connection in the configured version of the circuit design and determines whether or not a second signal value at a destination pin of the expected source-destination connection matches the first signal value. The connectivity checker also verifies that the signal values at the constant value pins remain at the expected values. An example connectivity checker is shown in Example

```
module testbench;
  //copyright XILINX, INC., 2014
  semaphore get_key = new(1);
  generate
    if(condition1) begin
      `signal_check(debug_info_1a,signal_width_1a,
        source_signal_1a,dest_signal_1a)
      `signal_check(debug_info_1b,signal_width_1b,
        source_signal_1b,dest_signal_1b)
    end
    if(condition2) begin
      `signal_check(debug_info_2a,signal_width_2a,
        source_signal_2a,dest_signal_2a)
      `signal_check(debug_info_2b,signal_width_2b,
        source_signal_2b,dest_signal_2b)
    end
    if(condition3) begin
      `signal_assert(debug_info_3,dest_signal_3, constant)
    end
    ......
  endgenerate
```

EXAMPLE 1

In Example 1, the connectivity checker is shown as a System Verilog module named testbench. Checker macros are called inside a generate block. Execution of a macro depends on the parameter values and condition signals when the circuit design is generated. For example, condition1 in the if statement is evaluated using the user-specified parameter values. If condition1 evaluates to true, then the macro is executed for signals 1a and 1b as shown. In the macro call, debug_info_1a specifies information needed to trace a failure, signal_width_1a specifies the number of bits in signal 1a, source_signal_1a specifies the source pin for the expected source-destination connection, and dest_signal_1a specifies the destination pin for the expected source-destination connection.

The signal_check macro tests the expected connections of source pins to destination pins for a signal. The signal_assert macro tests a pin that is expected to remain at a constant value or expected to remain unconnected. For example, a signal may be tied to ground (value=0), tied to power supply (value=1), or float (value=Z). In all these scenarios a separate assertion macro can be implemented to verify that the values of the signals are not unknown (X) and remain at the expected constant values (either 0, 1 or Z).

At block 110, a simulation is performed using the connectivity checker. In an example implementation, individual circuit blocks in the circuit design are replaced with dummy circuit blocks. This permits the connectivity to be simulated without having to exercise the functionality of the circuit design, thereby saving considerable time. The dummy circuit blocks need only specify port names mapped to signals of the circuit design.

Figure 2:
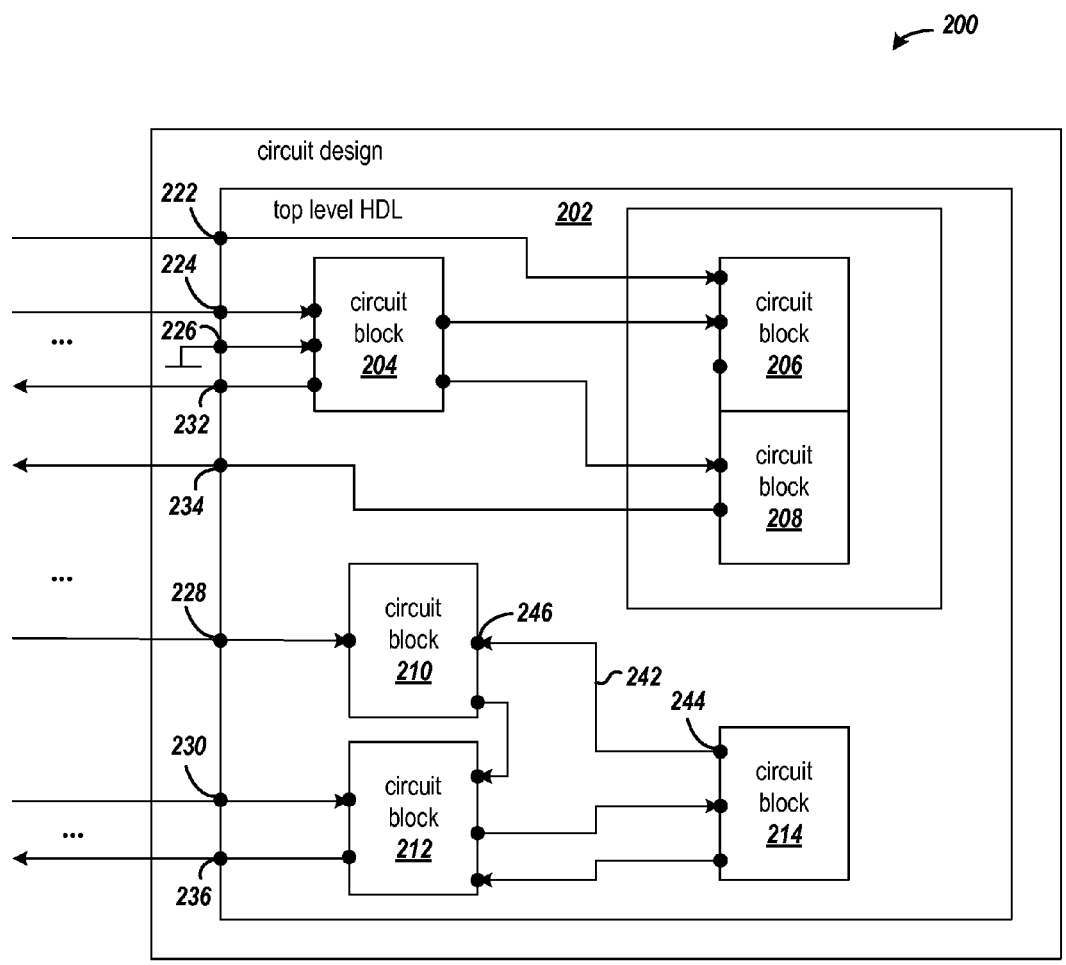
FIG. 2 is a block diagram that illustrates circuit blocks in a circuit design, and the connections between source and destination pins of the ports of the circuit blocks.

FIG. 2 is a block diagram that illustrates circuit blocks in a circuit design 200, and the connections between source and destination pins of the ports of the circuit blocks. The source-destination connections between the circuit blocks illustrate those that would be generated by a design tool based on parameter values input by a user. The circuit design includes a top level HDL block 202, which includes circuit blocks 204, 206, 208, 210, 212, and 214. The input port of the top level HDL block includes pins 222, 224, 226, 228, and 230. The output port of the top level HDL block includes pins 232, 234, and 236. The circuit blocks 204, 206, 208, 210, 212, and 214 similarly include pins on the respective input and output ports.

Each signal connection is shown as a line that begins at a source pin and ends at a destination pin. For example, signal connection 242 begins at source pin 244 and ends at destination pin 246.

Figure 3:
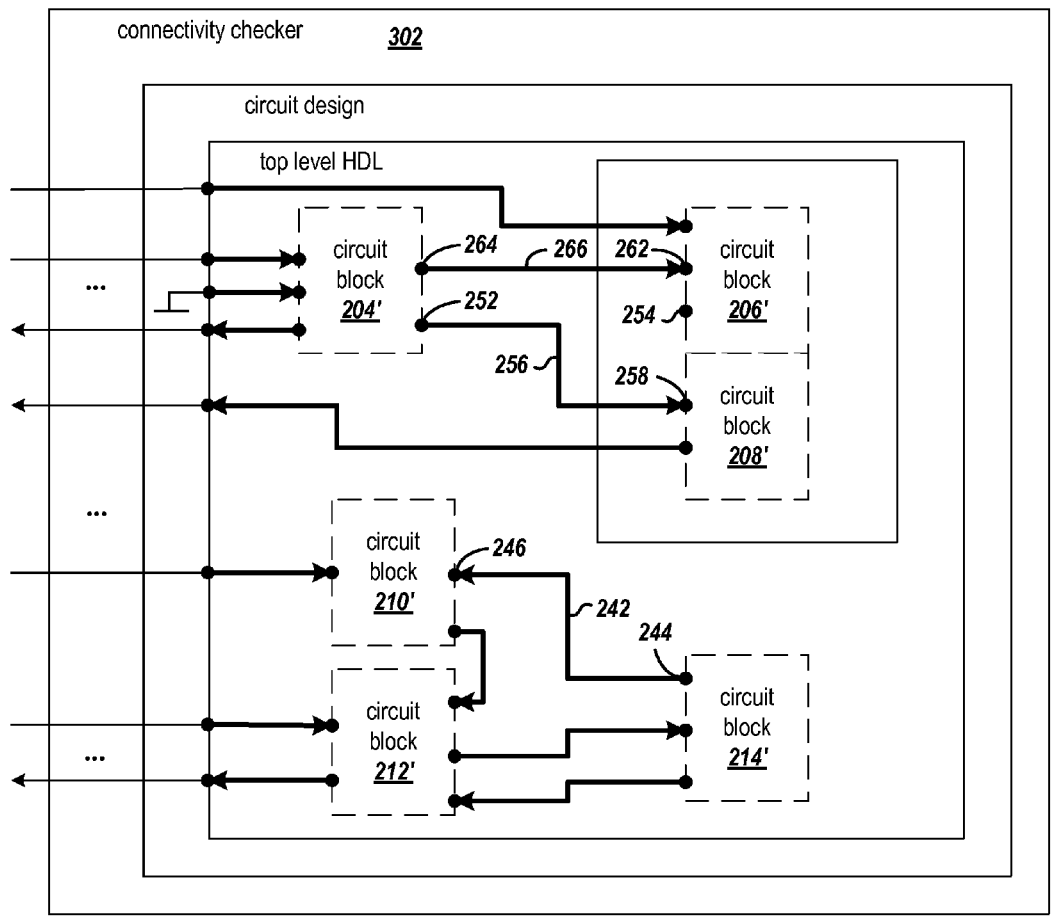
FIG. 3 is a block diagram illustrating a connectivity checker that wraps the circuit design and provides the capability to test the connectivity between the ports of the circuit blocks in the circuit design.

FIG. 3 is a block diagram illustrating a connectivity checker 302 that wraps the circuit design and provides the capability to test the connectivity between the ports of the circuit blocks in the circuit design. The actual signal connections as generated by the design tool are shown as thick, dark lines in the diagram. The HDL code in the connectivity checker verifies that the actual signal connections shown in FIG. 3 are consistent with the expected signal connections that are determined based on the input parameter values. The connectivity checker verifies the signal connections, but bypasses functional testing of the circuit blocks. As such, the circuit blocks 204, 206, 208, 210, 212, and 214 of FIG. 2 are replaced by dummy circuit blocks 204', 206', 208', 210', 212', and 214', which are shown as dashed blocks in FIG. 3.

The HDL code in the connectivity checker tests the expected signal connections one at a time. For each expected signal connection, the HDL code forces a signal value on the source pin of one of the expected source-destination connections in the configured version of the circuit design and determines whether or not the signal value at the destination pin of the expected source-destination connection matches. For example, if an expected source-destination connection includes pins 244 and 246, the connectivity checker forces a signal value at pin 244 and determines whether or not the signal value at pin 246 matches the forced signal value. If the signal values match, then the signal connection 242 is correct.

An erroneous signal connection is detected when the forced signal value at the source pin of an expected source-destination connection does not match the signal value at the destination pin of the expected source-destination connection. For example, if an expected source-destination connection includes source pin 252 and destination pin 254, the signal value forced at the source pin 252 would not match the signal value at the destination pin 254 of the expected source-destination connection, because the signal connection 256 as generated by the design tool connects pin 252 to pin 258. In another example, if one expected source-destination connection includes source pin 252 and destination pin 262 and another expected source-destination connection includes source pin 264 and destination pin 258, the signal value forced at the source pin 252 would not match the signal value at the destination pin 262 of the expected source-destination connection, because the generated signal connection 256 connects pin 252 to pin 258. Similarly, the signal value forced at the source pin 264 would not match the signal value at the destination pin 258 of the expected source-destination connection, because the generated signal connection 266 connects pin 264 to pin 262.

The HDL code in Example 2 shows the macro called by the connectivity checker of Example 1.

```
`define signal_check(debug_info,signal_width,source_signal,dest_signal) \
    //copyright XILINX, INC., 2014
    initial begin \
    force source_signal = 0;\
    logic stop;\
    logic start; \
    start =0;\
    stop =0;\
    fork \
    begin \
        forever begin \
            while (!stop || start) begin \
                @(posedge clk)
                assert (dest_signal ==0) else display ("ERR_%s,@time%p,
                dest_signal=%d does not stay stable when it supposed to be",
                debug_info,$realtime, dest_signal) \
            end \
        end
    end \
    begin \
        logic[(width-1):0] internal_signal;\
        get_key.get(1);\
        stop =1; \
        force source_signal = 0;\
        #1.0;\
        assern(source_signal ===dest_signal) else $display (", CHK_CON_ERR_%s,
            @time%p,source=%d does not match destination=%d", debug_info,
            $realtime,source_signal, dest_signal);\
        internal_signal = 1;\
        #1.0; \
        for(int i=0; i<width; i++) begin \
            force source_signal = internal_signal;\
            #1.0; \
            assert(source_signal === dest_signal) else $display("CHK_CON_ERR_%s,
                @time%p,source=%d does not match destination=%d", debug_info,
                $realtime,source_signal, dest_signal);\
            #1.0; \
            internal_signal = (internal_signal <<1); \
        end\
        release source_signal; \
        get_key.put(1);\
        stop =0; \
        start =1;\
    end \
    join_any \
    end
```

EXAMPLE 2

The checker macro of Example 2 uses the fork-join feature to execute two independent processes in parallel. One process performs destination signal stability checking and the other process waits to obtain semaphore key to perform signal connectivity checking. The process that performs signal connectivity checking triggers start and stop signal values, which controls the process that performs stability checking being on or off. When the semaphore key is held by another signal checker, the process performing stability checking is on, and the instant signal connectivity checker is off. When the semaphore key is held by the instant signal connectivity checker, the stability checking is off.

Example 3 illustrates a checker macro for verifying that the signal value at a pin remains at an expected value.

'define signal_assert(debug_info,dest_signal, constant)\
  //copyright XILINX, INC., 2014
  always @(posedge clk) begin\
  assert(dest_signal===constant && dest_signal !==X) else
    $display
  (",CHK_CON_ERR_% s,@time % p,destination=% d
    does not stay constant
  =% d",debug_info,$realtime, dest_signal, constant);\
  end

EXAMPLE 3

Figure 4:
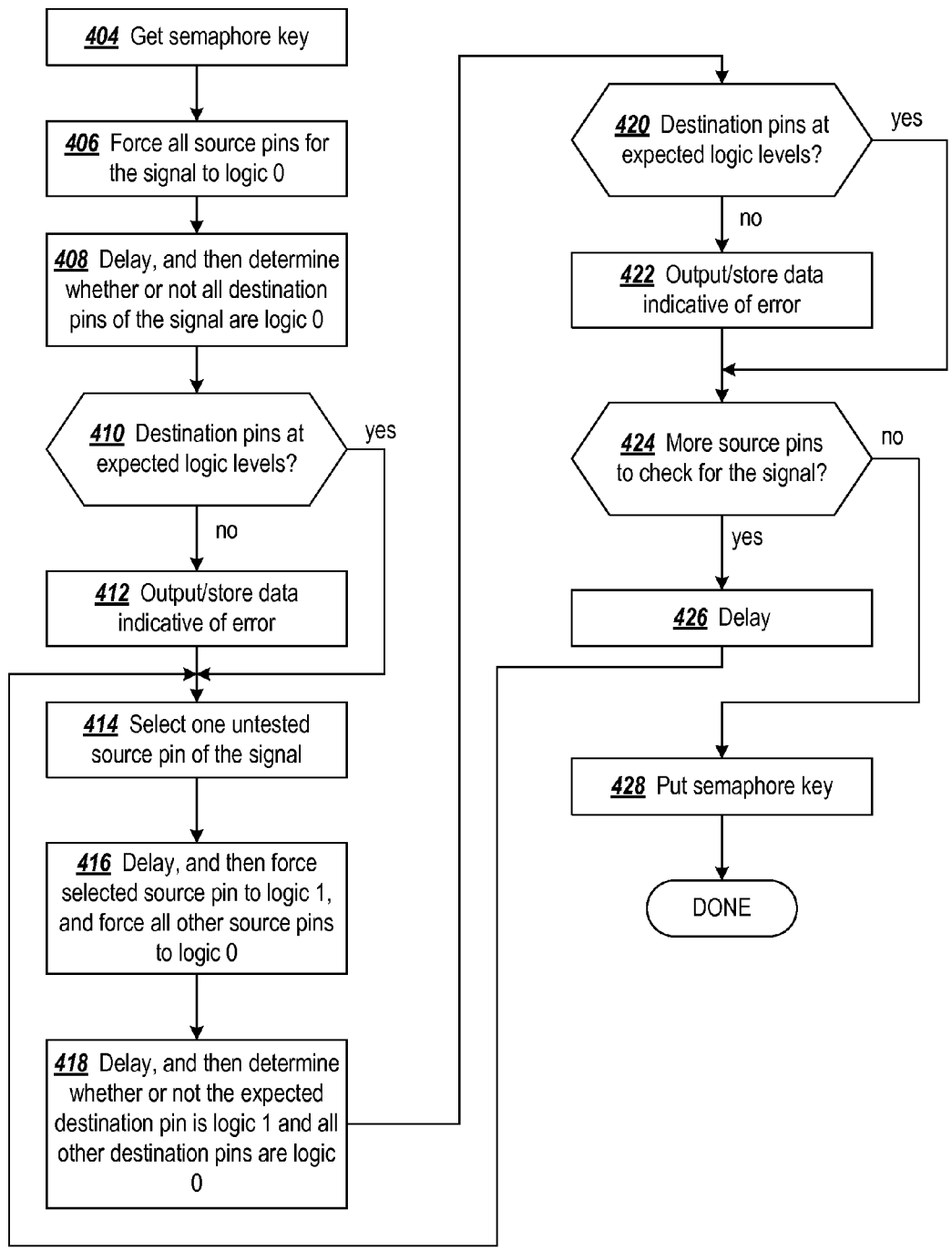
FIG. 4 illustrates in flowchart form the actions performed to check the connectivity between source pins and destination pins of signals of a circuit design.

FIG. 4 illustrates in flowchart form the actions performed to check the connectivity between source pins and destination pins of signals of a circuit design. The signal referenced in FIG. 4 may be either a single bit signal or a multi-bit signal. A semaphore is used to enforce one at a time testing of the expected signal connections of the circuit design.

At block 404, the process gets a semaphore key. In System Verilog, a built-in class is provided to implement the semaphore. The semaphore may be useful in multi-process or multi-threaded implementations of the connectivity checker. If the semaphore is held by some other process, the requesting process is forced to wait until the semaphore is released by the other process. When the requesting process receives the semaphore, it proceeds to block 406.

At block 406, all the source pins of the expected source-destination connection are forced to logic value 0, and block 408 delays before determining whether or not all the corresponding destination pins are at logic value 0. The delays specified in the HDL are used to allow signal states to propagate and settle in the simulation. If any of the destination pins are not at logic value 0, decision block 410 directs the process to block 412 where data is output or stored to indicate an error was detected. Otherwise, the process continues at block 414.

Block 414 selects an untested one of the source pins of the expected source-destination connections. Block 416 delays, and then forces the selected source pin to logic value 1 and forces all the other source pins of the signal to logic value 0. At block 418, the process delays and then determines whether or not the destination pin that corresponds to the selected source pin has a logic value 1, and all the other destination pins of the signal have a logic value 0. If any of the destination pins do not have the expected logic value, decision block 420 directs the process to block 422 where data is output or stored to indicate an error was detected. Otherwise, the process continues at block 424. Though the examples shown in FIGS. 2 and 3 show one-to-one connections from source pins to destination pins, it will be appreciated that circuit designs may also include one-to-many connections from source pins to destination pins. That is, one source pin may be connected to two or more destination pins. For one-to-many connections, block 418 determines whether or not each of the two or more destination pins that correspond to the selected source pin have a logic value 1, and all the other destination pins of the signal have a logic value 0.

Decision block 424 determines whether or not there are more untested source pins in the expected source-destination connection (such as for a multi-bit signal). If there are more untested source pins in the expected source-destination connection, at block 426 the process delays and then continues at block 414 as described above. Otherwise, the semaphore key is returned to the simulator with a put operation at block 428. This signals to other processes that the semaphore is available.

Figure 5:
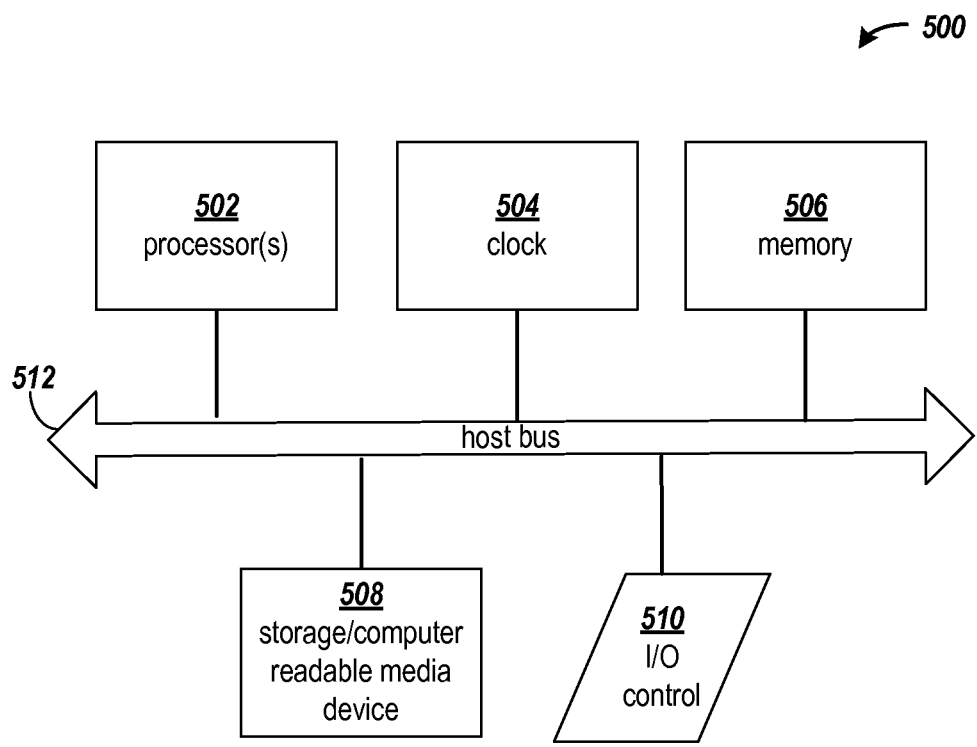
FIG. 5 shows a block diagram of an example computing arrangement on which the disclosed processes may be implemented.

FIG. 5 shows a block diagram of an example computing arrangement on which the disclosed processes may be implemented. It will be appreciated that various alternative computing arrangements, including one or more processors and a memory arrangement configured with program code, would be suitable for hosting the disclosed processes and data structures. The computer code, which implements the disclosed processes, is encoded in a processor executable format and may be stored and provided via a variety of computer-readable storage media or delivery channels such as magnetic or optical disks or tapes, electronic storage devices, or as application services over a network.

Processor computing arrangement 500 includes one or more processors 502, a clock signal generator 504, a memory arrangement 506, a storage arrangement 508, and an input/output control unit 510, all coupled to a host bus 512. The arrangement 500 may be implemented with separate components on a circuit board or may be implemented internally within an integrated circuit. When implemented internally within an integrated circuit, the processor computing arrangement is otherwise known as a microcontroller.

The architecture of the computing arrangement depends on implementation requirements as would be recognized by those skilled in the art. The processor(s) 502 may be one or more general purpose processors, or a combination of one or more general purpose processors and suitable co-processors, or one or more specialized processors (e.g., RISC, CISC, pipelined, etc.).

The memory arrangement 506 typically includes multiple levels of cache memory, and a main memory. The storage arrangement 508 may include local and/or remote persistent storage, such as provided by magnetic disks (not shown), flash, EPROM, or other non-volatile data storage. The storage unit may be read or read/write capable. Further, the memory arrangement 506 and storage arrangement 508 may be combined in a single arrangement.

The processor(s) 502 executes the software in storage arrangement 508 and/or memory arrangement 506, reads data from and stores data to the storage arrangement 508 and/or memory arrangement 506, and communicates with external devices through the input/output control arrangement 510. These functions are synchronized by the clock signal generator 504. The resource of the computing arrangement may be managed by either an operating system (not shown), or a hardware control unit (not shown).

Figure 6:
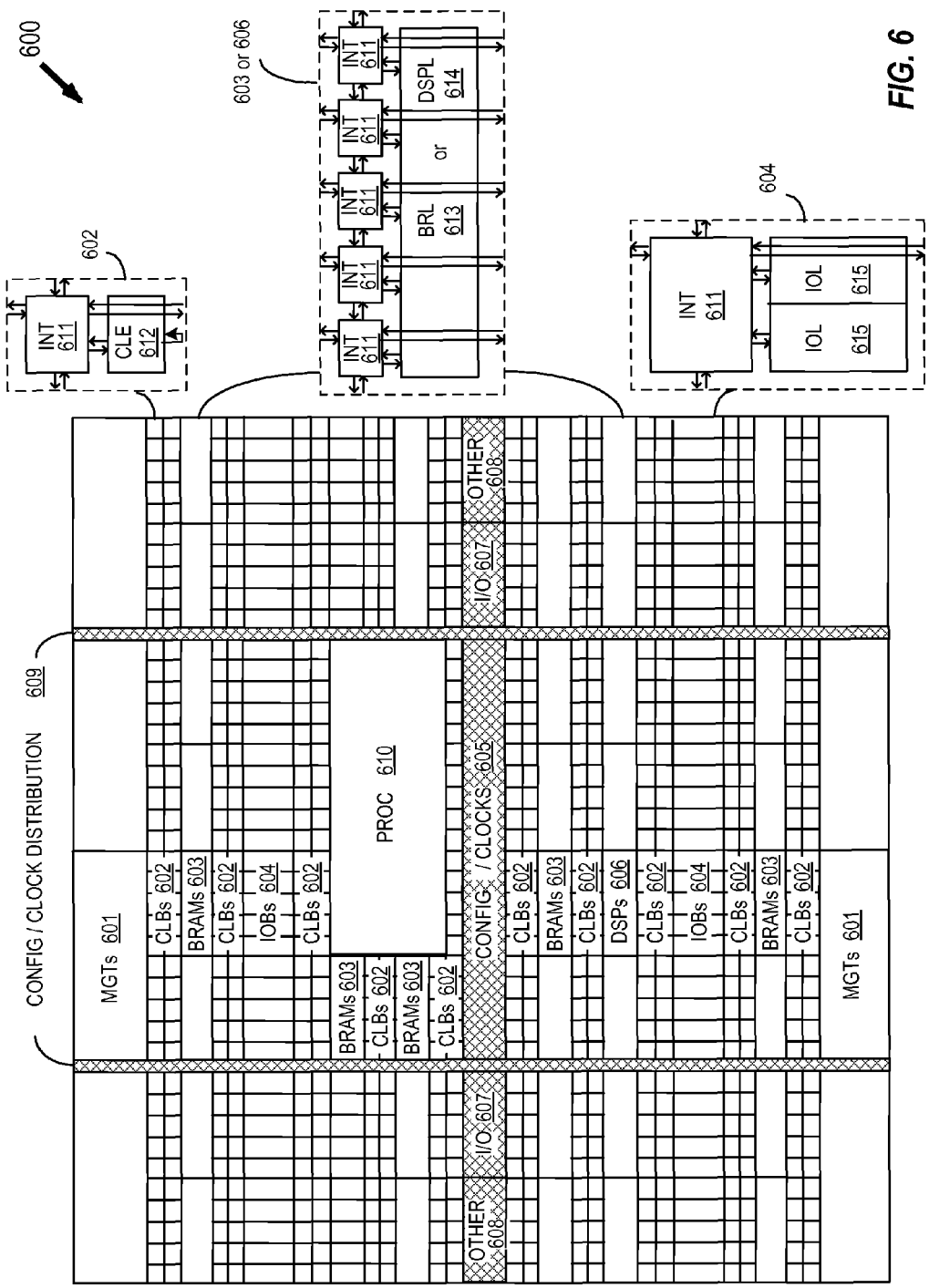
FIG. 6 shows an example of a programmable integrated circuit (IC) on which circuit designs may be implemented.

FIG. 6 shows an example of a programmable integrated circuit (IC) on which circuit designs may be implemented. The source and destination pins of the source-destination connections may be pins of circuit elements in the programmable IC.

The field programmable (FPGA) architecture (600) includes a large number of different programmable tiles including multi-gigabit transceivers (MGTs) 601, configurable logic blocks (CLBs) 602, random access memory blocks (BRAMs) 603, input/output blocks (IOBs) 604, configuration and clocking logic (CONFIG/CLOCKS) 605, digital signal processing blocks (DSPs) 606, specialized input/output blocks (I/O) 607, for example, clock ports, and other programmable logic 608 such as digital clock managers, analog-to-digital converters, system monitoring logic, and so forth. Some FPGAs also include dedicated processor blocks (PROC) 610 and internal and external reconfiguration ports (not shown).

In some FPGAs, each programmable tile includes a programmable interconnect element (INT) 611 having standardized connections to and from a corresponding interconnect element in each adjacent tile. Therefore, the programmable interconnect elements taken together implement the programmable interconnect structure for the illustrated FPGA. The programmable interconnect element INT 611 also includes the connections to and from the programmable logic element within the same tile, as shown by the examples included at the top of FIG. 6.

For example, a CLB 602 can include a configurable logic element CLE 612 that can be programmed to implement user logic, plus a single programmable interconnect element INT 611. A BRAM 603 can include a BRAM logic element (BRL) 613 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 606 can include a DSP logic element (DSPL) 614 in addition to an appropriate number of programmable interconnect elements. An 10B 604 can include, for example, two instances of an input/output logic element (IOL) 615 in addition to one instance of the programmable interconnect element INT 611. As will be clear to those of skill in the art, the actual I/O bond pads connected, for example, to the I/O logic element 615, are manufactured using metal layered above the various illustrated logic blocks, and typically are not confined to the area of the input/output logic element 615.

In the pictured embodiment, a columnar area near the center of the die (shown shaded in FIG. 6) is used for configuration, clock, and other control logic. Horizontal areas 609 extending from this column are used to distribute the clocks and configuration signals across the breadth of the FPGA.

Some FPGAs utilizing the architecture illustrated in FIG. 6 include additional logic blocks that disrupt the regular columnar structure making up a large part of the FPGA. The additional logic blocks can be programmable blocks and/or dedicated logic. For example, the processor block PROC 610 shown in FIG. 6 spans several columns of CLBs and BRAMs.

Note that FIG. 6 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 6 are purely exemplary. For example, in an actual FPGA, more than one adjacent column of CLBs is typically included wherever the CLBs appear, to facilitate the efficient implementation of user logic.

Though aspects and features may in some cases be described in individual figures, it will be appreciated that features from one figure can be combined with features of another figure even though the combination is not explicitly shown or explicitly described as a combination.

The methods and system are thought to be applicable to a variety of systems for verifying signal connectivity of circuit designs. Other aspects and features will be apparent to those skilled in the art from consideration of the specification. The methods and system may be implemented as one or more processors configured to execute software, as an application specific integrated circuit (ASIC), or as a logic on a programmable logic device. It is intended that the specification and drawings be considered as examples only, with a true scope of the invention being indicated by the following claims.

What is claimed is:

1. A method of verifying connectivity of signals in a circuit design, comprising:
    on a programmed processor, performing operations including:
    inputting parameter values that customize a parameterizable version of the circuit design;
    generating a configured version of the circuit design based on the input parameter values, wherein the configured version specifies connections from a plurality of source pins of ports of circuit blocks of the configured version to a plurality of destination pins of ports of circuit blocks of the configured version;
    determining from the input parameter values, expected source-destination connections between source pins and destination pins of the ports of the circuit blocks of the configured version; and
    generating a connectivity checker that includes an HDL code, wherein for each expected source-destination connection of the expected source-destination connections the HDL code forces a first signal value on a source pin of said each expected source-destination connection in the configured version of the circuit design and determines whether or not a second signal value at a destination pin of said each expected source-destination connection matches the first signal value.

2. The method of claim 1, wherein for each expected source-destination connection of the expected source-destination connections, the HDL code tests connectivity of the expected source-destinations one at a time.

3. The method of claim 2, wherein for each expected source-destination connection of the expected source-destination connections, the HDL code:
    waits for a semaphore key to become available before forcing the first signal value on the source pin of said each expected source-destination connection; and
    signals that the semaphore key is available after determining whether or not the second signal value at the destination pin of said each expected source-destination connection in the configured version of the circuit design matches the first signal value.

4. The method of claim 1, wherein for an expected source-destination connection having a multi-bit signal and a plurality of source pins and a corresponding plurality of destination pins, the HDL code:
    forces one source pin of the plurality of source pins to the first signal value;
    forces all other source pins of the plurality of source pins other than the one source pin to a third signal value, wherein the third signal value is different from the first signal value;
    determines whether or not a signal value at one of the destination pins corresponding to the one source pin matches the first signal value;
    determines whether or not signal values at other destination pins corresponding to the other source pins matches the third signal value; and repeats, for each of the other source pins as the one source pin, the forcing to the first signal value, the forcing to the third signal value, the determining at the one destination pin, and the determining at the other destination pins.

5. The method of claim 1, the operations further including:
replacing the circuit blocks of the configured version of the circuit design with dummy circuit blocks; and
simulating the connectivity checker and the configured version of the circuit design having the dummy circuit blocks.

6. The method of claim 5, wherein the simulating includes for each expected source-destination connection of the expected source-destination connections, the HDL code forcing the first signal value on the source pin of said each expected source-destination connection in the configured version of the circuit design and determining whether or not the second signal value at the destination pin of said each expected source-destination connection in the configured version of the circuit design matches the first signal value.

7. The method of claim 1, wherein for each expected source-destination connection of the expected source-destination connections, the HDL code includes a respective call to a macro that identifies the source and destination pins of the expected source-destination connections.

8. The method of claim 7, wherein the respective calls to the macro test connectivity of the expected source-destinations one at a time.

9. The method of claim 8, wherein for each expected source-destination connection of the expected source-destination connections, the macro:
waits for a semaphore key to become available before forcing the first signal value on the source pin of said each expected source-destination connection; and
signals that the semaphore key is available after determining whether or not the second signal value at the destination pin of said each expected source-destination connection in the configured version of the circuit design matches the first signal value.

10. The method of claim 9, wherein for an expected source-destination connection having a multi-bit signal and a plurality of source pins and a corresponding plurality of destination pins, the macro:
forces one source pin of the plurality of source pins to the first signal value;
forces all other source pins of the plurality of source pins other than the one source pin to a third signal value, wherein the third signal value is different from the first signal value;
determines whether or not a signal value at one of the destination pins corresponding to the one source pin matches the first signal value;
determines whether or not signal values at other destination pins corresponding to the other source pins matches the third signal value; and
repeats, for each of the other source pins as the one source pin, the forcing to the first signal value, the forcing to the third signal value, the determining at the one destination pin, and the determining at the other destination pins.

11. The method of claim 1, further comprising:
determining from the input parameter values, expected constant values for constant value pins of the circuit blocks of the configured version; and
generating a constant value checker that includes HDL code, wherein for each constant value pin of the constant value pins the HDL code forces a constant signal value on said each constant value pin in the configured version of the circuit design and determines whether or not a signal value at said each constant value pin matches the constant signal signal value.

12. A system of verifying connectivity of signals in a circuit design, comprising:
one or more processors;
a memory coupled to the one or more processors, wherein the memory is configured with instructions that when executed by the one or more processors, cause the one or more processors to:
input parameter values that customize a parameterizable version of the circuit design;
generate a configured version of the circuit design based on the input parameter values, wherein the configured version specifies connections from a plurality of source pins of ports of circuit blocks of the configured version to a plurality of destination pins of ports of circuit blocks of the configured version;
determine from the input parameter values, expected source-destination connections between source pins and destination pins of the ports of the circuit blocks of the configured version; and
generate a connectivity checker that includes an HDL code, wherein for each expected source-destination connection of the expected source-destination connections, the HDL code forces a first signal value on a source pin of said each expected source-destination connection in the configured version of the circuit design and determines whether or not a second signal value at a destination pin of said each expected source-destination connection matches the first signal value.

13. The system of claim 12, wherein for each expected source-destination connection of the expected source-destination connections, the HDL code tests connectivity of the expected source-destinations one at a time.

14. The system of claim 13, wherein for each expected source-destination connection of the expected source-destination connections, the HDL code:
waits for a semaphore key to become available before forcing the first signal value on the source pin of said each expected source-destination connection; and
signals that the semaphore key is available after determining whether or not the second signal value at the destination pin of said each expected source-destination connection in the configured version of the circuit design matches the first signal value.

15. The system of claim 12, wherein for an expected source-destination connection having a multi-bit signal and a plurality of source pins and a corresponding plurality of destination pins, the HDL code:
forces one source pin of the plurality of source pins to the first signal value;
forces all other source pins of the plurality of source pins other than the one source pin to a third signal value, wherein the third signal value is different from the first signal value;
determines whether or not a signal value at one of the destination pins corresponding to the one source pin matches the first signal value;
determines whether or not signal values at other destination pins corresponding to the other source pins matches the third signal value; and
repeats, for each of the other source pins as the one source pin, the forcing to the first signal value, the forcing to the third signal value, the determining at the one destination pin, and the determining at the other destination pins.

16. The system of claim 12, wherein the instructions when executed by the one or more processors, cause the one or more processors to:
    replace the circuit blocks of the configured version of the circuit design with dummy circuit blocks; and
    simulate the connectivity checker and the configured version of the circuit design having the dummy circuit blocks.

17. The system of claim 16, wherein the instructions that cause the one or more processors to simulate include instructions that for each expected source-destination connection of the expected source-destination connections, cause the one or more processors to force the first signal value on the source pin of said each expected source-destination connection in the configured version of the circuit design and determine whether or not the second signal value at the destination pin of said each expected source-destination connection in the configured version of the circuit design matches the first signal value.

18. The system of claim 12, wherein for each expected source-destination connection of the expected source-destination connections, the HDL code includes a respective call to a macro that identifies the source and destination pins of said each expected source-destination connections.

19. The system of claim 18, wherein the respective calls to the macro test connectivity of the expected source-destinations one at a time.

20. The system of claim 19, wherein for each expected source-destination connection of the expected source-destination connections, the macro:
    waits for a semaphore key to become available before forcing the first signal value on the source pin of said each expected source-destination connection; and
    signals that the semaphore key is available after determining whether or not the second signal value at the destination pin of said each expected source-destination connection in the configured version of the circuit design matches the first signal value.

\* \* \* \* \*